US012685202B1

(12) United States Patent
Rohwer et al.

(10) Patent No.: US 12,685,202 B1
(45) Date of Patent: Jul. 14, 2026

(54) MULTIAXIAL MAGNETIC FIELD-ENABLED UNDERFILLING

(71) Applicant: National Technology & Engineering Solutions of Sandia, LLC, Albuquerque, NM (US)

(72) Inventors: Lauren E. S. Rohwer, Albuquerque, NM (US); James E. Martin, Tijeras, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 505 days.

(21) Appl. No.: 18/236,172

(22) Filed: Aug. 21, 2023

(51) Int. Cl.
*H01L 23/00* (2006.01)

(52) U.S. Cl.
CPC .............. *H01L 24/83* (2013.01); *H01L 24/32* (2013.01); *H01L 24/73* (2013.01); *H01L 2224/32225* (2013.01); *H01L 2224/73204* (2013.01); *H01L 2224/8309* (2013.01); *H01L 2224/83097* (2013.01); *H01L 2224/831* (2013.01); *H01L 2224/83191* (2013.01); *H01L 2224/83887* (2013.01)

(58) Field of Classification Search
CPC .......... H01L 24/83; H01L 24/32; H01L 24/73
See application file for complete search history.

(56) References Cited

U.S. PATENT DOCUMENTS

| | | | | |
|---|---|---|---|---|
| 11,211,356 B2* | 12/2021 | Lim | ......................... | H01L 24/84 |
| 11,915,999 B2* | 2/2024 | Naeve | ............... | H01L 23/49524 |
| 2010/0221582 A1* | 9/2010 | Kawai | ................ | G11B 5/73921 |
| | | | | 428/846 |
| 2016/0005726 A1* | 1/2016 | Chen | ....................... | H01L 25/03 |
| | | | | 257/737 |
| 2024/0063179 A1* | 2/2024 | Elsherbini | ............... | H01L 25/50 |

OTHER PUBLICATIONS

Martin, J. E. et al., "Strong intrinsic mixing in vortex magnetic fields," Physical Review E (2009) 80:016312, 6 pages.
Martin, J. E. et al., "Symmetry-breaking magnetic fields create a vortex fluid that exhibits a negative viscosity, active wetting, and strong mixing," Soft Matter (2014) 10:3993-4002.
Martin, J. E. et al., "Fully alternating, triaxial electric or magnetic fields offer new routes to fluid vorticity," Soft Matters (2015) 11:241-254.

(Continued)

*Primary Examiner* — Thao P Le
(74) *Attorney, Agent, or Firm* — Mark A. Dodd

(57) ABSTRACT

A method and corresponding system for employing fluid vorticity to drive an underfilling process with a magnetic particle-loaded curing resin is disclosed. An applied multi-axial magnetic field drives the magnetic particles, and thus the curing resin, throughout the gap between a die and corresponding carrier chip. A magnetic field generator, for example, a set of triaxial Helmholtz coils, may be driven with different frequencies and phases along each axis, and may further include a DC component along one or more axes. To further minimize voids, the die and carrier chip may be placed in a vacuum oven to assist in removing any air pockets.

20 Claims, 5 Drawing Sheets

600

(56)　　　　　　References Cited

OTHER PUBLICATIONS

Martin, J. E. et al., "Quantifying vorticity in magnetic particle suspensions driven by symmetric and asymmetric multiaxial fields," Soft Matter (2015) 11:7130-7142.

Martin, J. E. et al., "Creating orbiting vorticity vectors in magnetic particle suspensions through field symmetry transitions—a route to multi-axis mixing," Soft Matter (2016) 12:1021-1031.

Martin, J. E. et al., "On the origin of vorticity in magnetic particle suspensions subjected to triaxial fields," Soft Matter (2016) 12:5636-5644.

Solis, K. J. et al., "Torque density measurements on vortex fluidsproduced by symmetry-breaking rational magnetic fields," Soft Matter (2014) 10:6139-6146.

* cited by examiner

100

Torque Density (J/m³)

■ 500-1000
□ 0-500
■ -500-0
▨ -100- -500

600

MULTIAXIAL MAGNETIC FIELD-ENABLED UNDERFILLING

STATEMENT OF GOVERNMENT SUPPORT

This invention was made with Government support under Contract No. DE-NA0003525 awarded by the United States Department of Energy/National Nuclear Security Administration. The U.S. Government has certain rights in the invention.

BACKGROUND OF THE INVENTION

Field of the Invention

The present invention relates to the use of magnetic fields to maximize filling and minimize segregation when underfilling with a magnetic particle-loaded curing resin.

Brief Description of the Related Art

Many integrated circuits (ICs) take the form of a system-on-chip (SOC). An SOC typically includes several die attached to a carrier chip. The die may be electrically interconnected to the carrier chip using, for example, a ball grid array, an indium microbump array, a column grid array, a land grid array, a pin grid array, etc. While a ball grid array provides electrical interconnects between the die and the carrier chip, the die also need to be robustly mechanically attached to the carrier chip, preferably in a manner that improves the reliability of the electrical interconnects.

Traditionally, the die are mechanically attached to the carrier chip using a curing resin underfill. Problems arise, however, as it is difficult to get the curing resin to completely wick around the ball grid array between the die and the carrier chip, especially for larger die and for die with high numbers of balls in the ball grid array. These problems may be exacerbated by trenches in either the die or the carrier chip, or effective trenches that form between adjacent die, that act as barriers to the flow of the curing resin. This results in voids that cause stress distributions within the resultant SOC, which weaken the mechanical bond between the die and the carrier chip and can cause electrical interconnect failure. These voids may be due, for example, to trapped air pockets within the curing resin, poor flow of the curing resin (due, for example, to gelling during the underfill process), and/or aggregation or segregation of the components of the curing resin. In addition, the die in some SOCs may require thinning. Voids in the curing resin can cause fracturing of die during the corresponding thinning process.

Thus, the need exists for a more robust method to mechanically attach die to carrier chips.

SUMMARY OF THE INVENTION

One aspect of the present invention relates to a method and corresponding system for employing fluid vorticity to drive an underfilling process with a magnetic particle-loaded curing resin. An applied multiaxial magnetic field drives the magnetic particles, and thus the curing resin, throughout the gap between the die and corresponding carrier chip. A multiaxial magnetic field generator, for example, a set of triaxial Helmholtz coils, may be driven with different frequencies and phases along each axis, and may further include a DC component along one or more axes. To further minimize voids, the die and carrier chip may be placed in a vacuum oven to assist in removing any air pockets.

In at least one embodiment of the invention, a method comprises the steps of providing a carrier chip, providing one or more die, electrically interconnecting each of the one or more die to the carrier chip, preparing a curing resin by loading the curing resin with magnetic particles (thereby creating a magnetic particle-loaded curing resin), applying the magnetic particle-loaded curing resin along at least one edge of at least one of the one or more die, subjecting the one or more die and the carrier chip to a vacuum to remove at least a portion of air trapped in a space between the one or more die and the carrier chip, and subjecting the one or more die and the carrier chip to a multiaxial magnetic field to drive distribution of the magnetic particle-loaded curing resin throughout the space between the one or more die and the carrier chip.

In various embodiments, the step of preparing a curing resin includes at least one of sonication to reduce the number of magnetic particle clumps or vortex mixing process to disperse the magnetic particles within the curing resin; the magnetic particles include one or more magnetically soft materials; the magnetic particles include iron, nickel, iron oxide, and/or stainless steel; a size of the magnetic particles is less than or equal to approximately 33% of a size of a gap between the carrier chip and the one or more die; the magnetic particles comprise between approximately 5 vol. % and 20 vol. % of the magnetic particle-loaded curing resin; and a first portion of the magnetic particles have a first size, and a second portion of the magnetic particles have a second size (the second size being approximately 10% or less of the first size).

In other embodiments, the step of preparing a curing resin further includes loading the curing resin with nonmagnetic particles; the nonmagnetic particles cause a coefficient of thermal expansion of the magnetic particle-loaded curing resin to more closely match a coefficient of thermal expansion of the carrier chip or the one or more die; and a size of the nonmagnetic particles is less than or equal to approximately 33% of a size of a gap between the carrier chip and the one or more die or the nonmagnetic particles comprise between approximately 20 vol. % and 30 vol. % of the magnetic particle-loaded curing resin.

In still other embodiments, the step of applying the magnetic particle-loaded curing resin includes applying the magnetic particle-loaded curing resin along at least a portion of all sides of each of the one or more die; the step of subjecting the one or more die and the carrier chip to a vacuum employs a vacuum oven; and the step of subjecting the one or more die and the carrier chip to a vacuum further includes subjecting the one or more die and the carrier chip to a thermal process.

In yet other embodiments, the multiaxial magnetic field includes three orthogonal magnetic field components; a first and a second of the three orthogonal magnetic field components each includes a respective AC magnetic field component and a third of the three orthogonal magnetic field components includes a DC magnetic field component; a first, a second, and a third of the three orthogonal magnetic field components each includes a respective AC magnetic field component and the third of the three orthogonal magnetic field components further includes a DC magnetic field component; a phase angle exists between a first and a second of the three orthogonal magnetic field components; a ratio of a frequency of a first of the three orthogonal magnetic field components and a frequency of a second of the three orthogonal magnetic field components is a rational number greater than 1; a ratio of a frequency of a first of the three orthogonal magnetic field components and a frequency of a second of the three orthogonal magnetic field components is within 3% a rational number greater than 1; and a frequency of each magnetic field component of the multiaxial magnetic field is less than or equal to approximately 1 KHz.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION OF THE INVENTION

Figure 1:
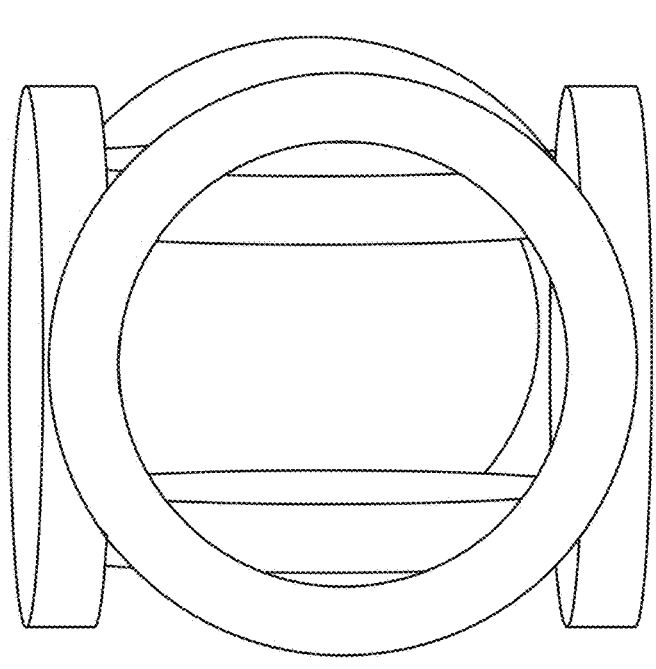
FIG. 1 illustrates a multiaxial magnetic field generator in the form of a set of triaxial Helmholtz coils that may be used to implement one or more embodiments of the present invention.

The terms "a" and "an" do not denote a limitation of quantity, but rather denote the presence of at least one of the referenced items. The term "or" means "and/or." The terms "comprising," "having," "including," and "containing" are to be construed as open-ended terms (i.e., meaning "including, but not limited to").

In at least one embodiment of the present invention, a curing resin, for example, an epoxy, is loaded with magnetic particles. The magnetic particles comprise, for example, approximately 1 to 40 vol. % of the curing resin, while a range of 5 to 20 vol. % may be more typical. These magnetic particles may include, for example, magnetically soft materials such as iron (Fe), nickel (Ni), iron oxide, or stainless steel. As will be appreciated by one of skill in the art, which type of magnetic particle is employed depends upon whether the underfill can be electrically conductive or not. For example, Fe or Ni magnetic particles can be used for electrically conductive applications, while magnetic particles of iron oxide (or Fe or Ni with an electrically insulating coating) can be used for electrically insulating applications. Nonmagnetic particles can also be added, if desired, to the curing resin to create a highly loaded underfill, with the nonmagnetic particles comprising, for example, approximately 20 to 30 vol. % of the curing resin. These nonmagnetic particles may include, for example, oxides such as silica, alumina, magnesium oxide, and nonmagnetic iron oxide, or nitrides such as boron nitride and aluminum nitride, which lowers the coefficient of thermal expansion (CTE) of the curing resin to match more closely that of the die and the carrier chip. The magnetic particles, and nonmagnetic particles if present, are preferably much smaller than a gap that is to be underfilled, for example, a size of the magnetic (and nonmagnetic) particles is equal to or less than approximately 33% of the gap between the die and the carrier chip. In at least one embodiment, 100 nm Ni magnetic nanoparticles were used to fill gaps as small as 3.5 microns between the die and the carrier chip. The curing resin in its initial uncured state should preferably have a low viscosity at the temperature at which the underfilling is to take place. It is also preferable that the magnetic particles initially be dispersed into one or the other components of the curing resin. In at least one embodiment, sonication is employed to break up any magnetic particle aggregates that might be present. The magnetic particle-loaded curing resin is then applied to one or more peripheral boundaries of the device to be underfilled. In at least one embodiment, the magnetic particle-loaded curing resin is applied along all four edges of a given die. When the magnetic particle-loaded curing resin is applied along all four edges of a given die, it is necessary to remove any air trapped by the curing resin, for example, by using a vacuum oven or similar device. A vacuum pressure of approximately 0.6 torr is sufficient to remove most of the trapped air in at least one embodiment.

Once the magnetic particle-loaded curing resin is applied, the system-on-chip (SOC) is heated to the desired temperature, for example, approximately 70 to 110° C., and is subjected to a multiaxial magnetic field, which may optionally be spatially uniform. The multiaxial magnetic field is preferably a magnetic field comprising three orthogonal components, at least two of which are alternating, i.e., AC. In at least one embodiment, the rms values of the orthogonal magnetic field components are equal, producing a so-called balanced triaxial magnetic field. A multiaxial magnetic field generator, for example, a set of triaxial Helmholtz coils 100 as illustrated in FIG. 1, may be used to generate the multiaxial magnetic field.

The multiaxial magnetic field, generated by the multiaxial magnetic field generator, is more accurately called a symmetry-breaking magnetic field. In at least one embodiment, the symmetry-breaking magnetic field H (t) is described as:

$$H(t) = H_{ac}\left[\sin(2\pi m f_0 t)\hat{x} + \sin\left(2\pi n f_0 t + 2\pi \frac{\varphi}{360°}\right)\hat{y}\right] + H_{dc}\hat{z}, \quad \text{(Eq. 1)}$$

where $H_{ac}$ and $H_{dc}$ are the respective magnitudes of the AC and DC components of the symmetry-breaking magnetic field, $f_0$ is the fundamental AC frequency (and may, for example, have a frequency of approximately 5 Hz to 500 Hz, such that the high frequency component has a frequency of approximately 1 KHz or less), the ratio of the high frequency to the low frequency components num is a rational number greater than 1, and φ is the phase angle between the low (m) and high (n) frequency components. This symmetry-breaking magnetic field exploits the symmetry of weak triaxial magnetic fields to induce flow in the magnetic particle-loaded curing resin.

Symmetry-breaking magnetic fields can take several forms, thereby allowing one to select the vorticity axis. For example, a frequency ratio of 2:1 for the multiaxial magnetic field generator produces strong vorticity around the low (m) frequency "1" field component, i.e., the $\hat{x}$ direction per Eq. 1, a ratio of 3:1 produces vorticity around the de field component, i.e., the $\hat{z}$ direction per Eq. 1, and a 3:2 field produces vorticity around the high (n) frequency "3" component, i.e., the $\hat{y}$ direction per Eq. 1. In general, it is possible to create vorticity around the high frequency $\hat{y}$, low frequency $\hat{x}$, or de field axis $\hat{z}$. Symmetry theory also shows that these flows can be reversed by an appropriate change in the phase between the two ac components.

Figure 2:
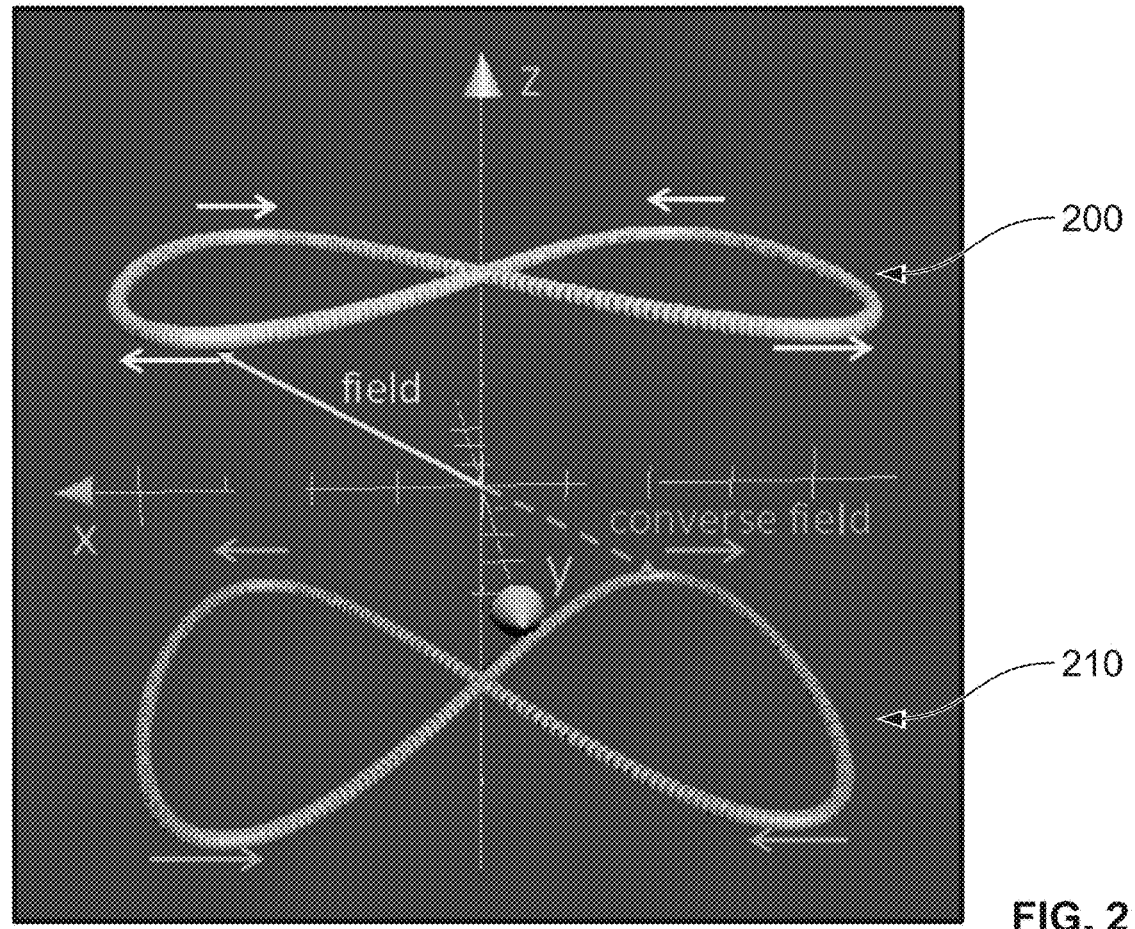
FIG. 2 illustrates the symmetry of a symmetry-breaking magnetic field that may be used to implement one or more embodiments of the present invention.

FIG. 2 illustrates the symmetry of the symmetry-breaking magnetic field 200 given by Eq. 1, along with its converse magnetic field 210. As illustrated in FIG. 2, the symmetry-breaking magnetic field 200 and the converse magnetic field 210 are in separate parallel planes. Because the symmetry-breaking magnetic field 200 and the converse magnetic field 210 lie in separate planes, this creates reversibility. Further, a rotational flow in the magnetic particle-loaded curing resin is imposed by the symmetry-breaking magnetic field 200 and the converse magnetic field 210 due to their symmetry of vorticity. As illustrated, there are antisymmetric 180° rotations about the $\hat{y}$ and $\hat{z}$ axes, and a symmetric rotation about the $\hat{x}$ axis, which corresponds to the low frequency axis. With this configuration of the symmetry-breaking magnetic field 200 and the converse magnetic field 210, the axis of fluid vorticity is along the $\hat{x}$ axis direction, i.e., the low frequency axis.

In other embodiments, the symmetry-breaking magnetic field may have AC components in all three directions, i.e., $\hat{x}$, $\hat{y}$, and $\hat{z}$, with this being termed a fully alternating triaxial magnetic field. In these embodiments, the ratio of frequency components remains a rational number, for example, 1:2:3, i.e., the $\hat{y}$ component has a frequency 2× that of the $\hat{x}$ component, while the $\hat{z}$ component has a frequency 3× that of the $\hat{x}$ component. A DC component can be added to one or more of the symmetry-breaking magnetic field components, while two independent phase angles exist between the symmetry-breaking magnetic field components.

Fully alternating triaxial magnetic fields can take several forms, again allowing one to select the vorticity axis. The frequency ratio 1:2:3 gives rise to strong vorticity around the "2" field component, the ratio 2:3:4 produces vorticity around the "3" component, the ratio 1:2:6 produces vorticity around the "1" component. With fully alternating triaxial magnetic fields, there are two independent phase angles that allow control of the magnitude and sign of the vorticity vector. In sum, for fully alternating triaxial magnetic fields it is possible for the vorticity axis to align with the low, medium, or high frequency magnetic field component.

Field symmetry transitions, the case when one combines a DC magnetic field component with a particular AC magnetic field component can take several forms, again allowing one to select the vorticity axis. For example, one may generate a field symmetry transition having the form of 1+DC:2:3, wherein the DC magnetic field is combined with the "1" component. The 1:2:3 field produces vorticity in the "2" direction, whereas the dc:2:3 field produces vorticity along the "3" direction. For this reason, one might expect that the 1+dc:2:3 field would produce vorticity in the "2"-

"3" component plane, but instead the vorticity has a significant component along the "1" direction.

Figure 3:
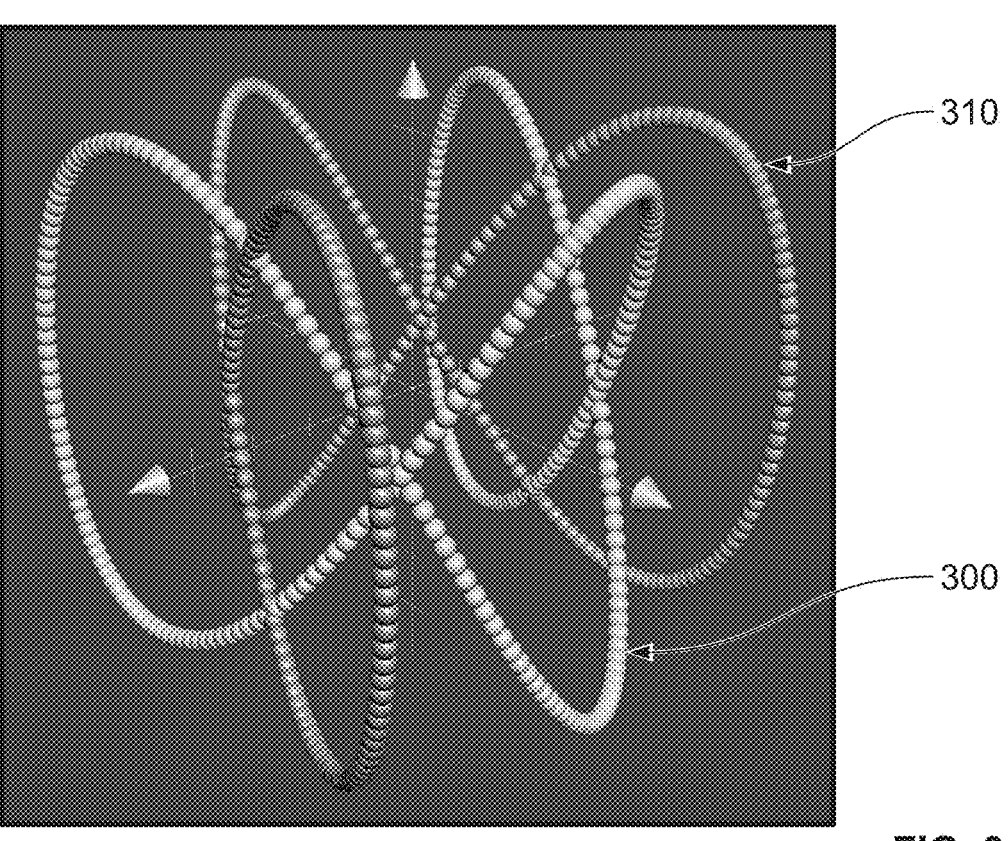
FIG. 3 illustrates the symmetry of another symmetry-breaking magnetic field that may be used to implement one or more embodiments of the present invention.
Figure 4:
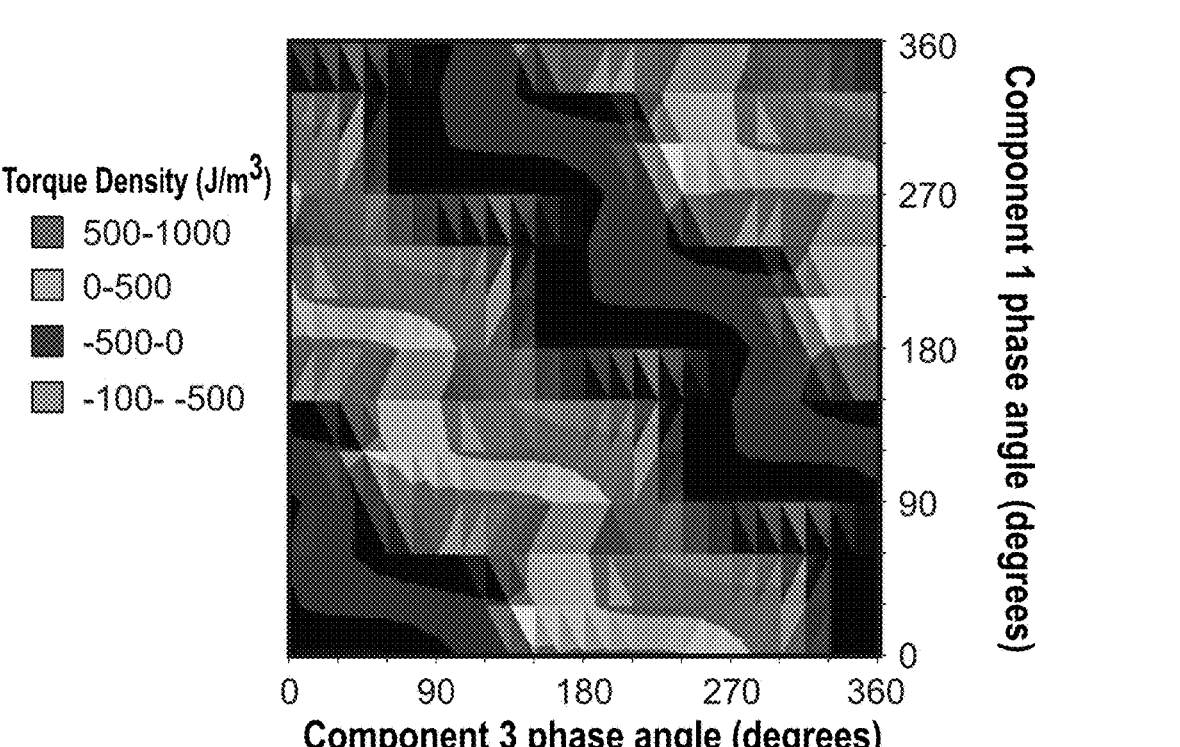
FIG. 4 illustrates the simulated torque density as a function of phase angles that may be achieved with one or more embodiments of the present invention.
Figure 5:
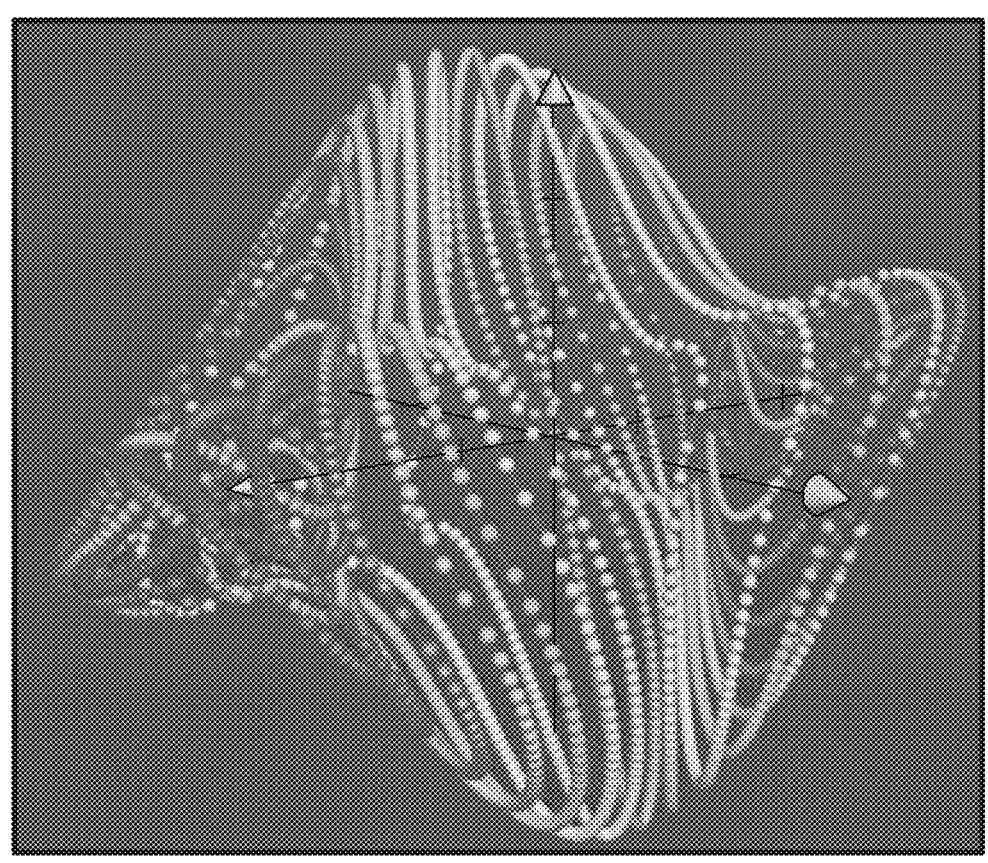
FIG. 5 illustrates the symmetry of yet another symmetry-breaking magnetic field that may be used to implement one or more embodiments of the present invention.

FIG. 3 illustrates the symmetry-breaking magnetic field 300 and the converse magnetic field 310 for a fully alternating triaxial magnetic field having a ratio of frequency components of 1:2:3. Because of the two independent phase angles between the three magnetic field components, one can readily control the torque density, i.e., the mixing force, imposed on the curing resin by the fully alternating triaxial magnetic field, as shown in the simulation results illustrated in FIG. 4, which employed a fundamental AC frequency $f_0$ of 50 Hz. (A full color version of FIG. 4 may be found in J. E. Martin and K. J. Solis, "Fully alternating, triaxial electric or magnetic fields offer new routes to fluid vorticity," Soft Matter, vol. 11, pp. 241-254 (2015).) FIG. 5, similar to FIG. 3, illustrates simulation results, but with the addition of a DC bias field along one axis. See J. E. Martin and K. J. Solis, "Creating orbiting vorticity vectors in magnetic particle suspensions through field symmetry transitions-a route to multi-axis mixing," Soft Matter, vol. 12, pp. 1021-1031 (2016) for additional details regarding FIG. 5.

Figure 6:
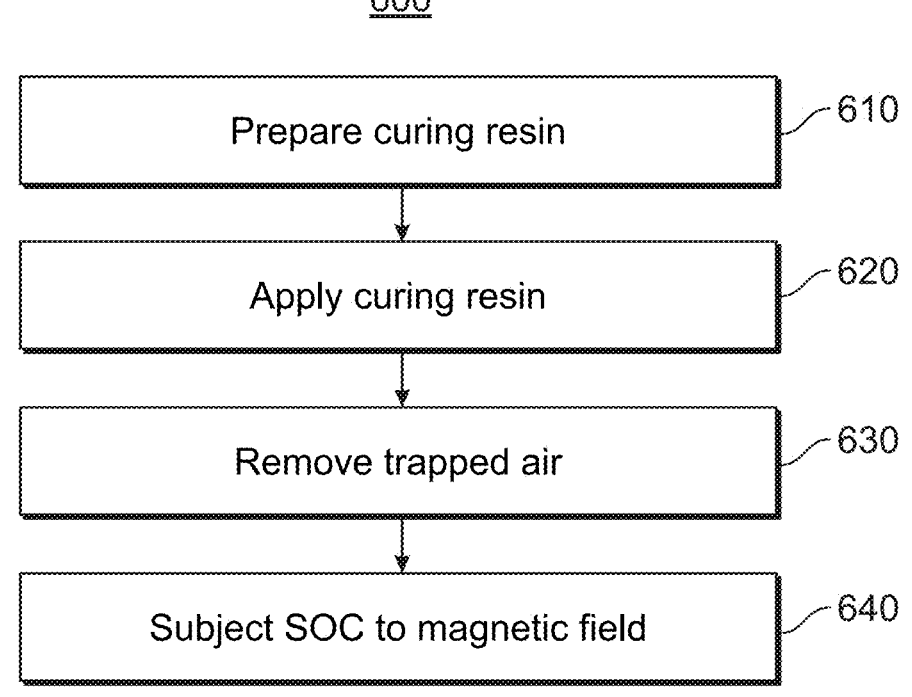
FIG. 6 is a flowchart of a magnetic particle-loaded curing resin underfilling process in accordance with one or more embodiments of the present invention.

FIG. 6 is a flowchart illustrating at least one embodiment of a magnetic particle-loaded curing resin underfilling process 600. In step 610, the curing resin is prepared by loading it with at least magnetic particles and optionally with nonmagnetic particles. Step 610 may include sonication to help break up any potential clumps of the magnetic particles and optional nonmagnetic particles. The sonication process may have a duration of, for example, two to four hours. Step 610 may also include using a vortex mixer to better disperse the magnetic particles and optional nonmagnetic particles. The vortex mixer process may have a duration of, for example, 30 to 90 seconds. In step 620, the magnetic particle-loaded curing resin prepared in step 610 is applied along at least one edge of a die attached to a carrier chip, and potentially along as many as all four edges of the die. If the magnetic particle-loaded curing resin is applied along all four edges of a die, it is preferable to leave one or more of the corners open. The magnetic particle-loaded curing resin may be applied along at least one edge of the die attached to the carrier chip using, for example, a needle or syringe. If multiple die are attached to the carrier chip, the magnetic particle-loaded curing resin may be applied along one edge of one of the die, with step 640 driving the magnetic particle-loaded curing resin to underfill all of the die.

In step 630, at least a portion of the trapped air between the die and carrier chip is removed. Step 630 may be implemented, for example, by placing the die and carrier chip in a vacuum oven. The vacuum oven may operate at a vacuum pressure of, for example, between approximately 0.1 torr and 1.0 torr, and a temperature of, for example, between approximately 60° C. and 80° C. As will be appreciated by one of skill, the specific pressure and temperature will be a function of the specific curing resin employed. Step 630 generally causes the magnetic particle-loaded curing resin to wick around the full perimeter of the die when the magnetic particle-loaded curing resin is applied along all four edges of the die, thereby sealing the gap between the die and the carrier chip. In step 640, the die and carrier chip, i.e., the SOC, is subjected to a multiaxial magnetic field, which is optionally spatially uniform, to drive distribution of the magnetic particle-loaded curing resin throughout the SOC. Step 640 may be implemented, for example, with a set of triaxial Helmholtz coils, such as that illustrated in FIG. 1. To help ensure flow of the magnetic particle-loaded curing resin, a heated block may be placed within the triaxial Helmholtz coils, with the SOC placed on the heated block. It has been determined experimentally that process steps 610-630, corresponding to the prior art underfilling process, took approximately 48 hours to achieve full underfill. In contrast, the inclusion of step 640, in accordance with one or more embodiments, resulted in a full underfill in approximately 30 seconds, when used with a curing resin containing 5 vol. % Ni.

One may consider the torque generated by the applied magnetic field as follows. At the simplest level, one can consider the torque generated by a pair of spherical magnetic particles suspended in a liquid and held in contact by their magnetic field-induced dipolar interaction. These particles are comprised of a magnetically soft material, so that they have negligible remanent magnetization, and their magnetic moment is proportional to their instantaneous local field. Let the applied magnetic field consist of two ac orthogonal components of identical frequencies, for example, in the range of 5-200 Hz, in quadrature phase to create a biaxial rotating magnetic field. If the magnetic field magnitude is fixed, the magnetic field frequency is low, and the viscosity of the suspending fluid, for example, a curing resin, is low, the particles will rotate at the magnetic field frequency. However, the line of the magnetic particle centers will lag the magnetic field vector, creating a torque on the suspending fluid, and thus inducing vorticity. If the magnetic field frequency is steadily increased, the phase lag will increase, until the dipolar interaction between the magnetic particles becomes repulsive and they separate. If the magnetic particles have negligible magnetic remanence, they will not rotate with the magnetic field and the torque on the suspending fluid will stop. Likewise, if the viscosity of the suspending fluid becomes too high, for, example, due to resin cure, or the magnetic field strength becomes too low, the magnetic particles will separate, again causing the torque on the suspending fluid to stop.

Although a biaxial rotating magnetic field can create torque in a suspending fluid, at the volume fractions employed in various embodiments the particles will form roughly equally spaced hexagonal sheets in the magnetic field plane, and this static structure will not induce vorticity. However, a DC magnetic field applied normal to the plane of the biaxial rotating magnetic field will prevent sheet formation and will instead form magnetic particle chains that lag the magnetic field vector. These magnetic particle chains will spin around in a precessional motion, exerting a torque on the suspending fluid and creating vorticity. This vorticity can easily be strong enough to cause the suspending fluid to cross a surface with wide or deep trenches, an especially useful trait when underfilling an SOC having trenches formed between adjacent dic.

The following describes the multiaxial magnetic field employed in at least one embodiment of the magnetic particle-loaded curing resin underfilling process. Triaxial magnetic fields can create strong fluid vorticity, i.e., the torque density in the curing resin, when the dimensionless Mason number Mn is less than ~0.02, scc Eq. 2 below. See J. E. Martin et al., "Strong intrinsic mixing in vortex magnetic fields," Physical Review E, vol. 80, art. no. 016312 (2009) for a description of triaxial magnetic fields and their use in generating fluid vorticity for fluid mixing applications, i.e., not underfilling applications which do not use fluid vorticity for fluid mixing. The Mason number is the ratio of viscous forces that work to prevent particles from pairing to the magnetic polarization forces between particles, which encourages the particle aggregation necessary for strong fluid vorticity to occur. Strong magnetic fields, low magnetic field frequencies, and a low viscosity of the magnetic particle-loaded curing resin enhance fluid vorticity, as reflected in Eq. 2 below. The frequency ratio or ratios of the magnetic field components is also a critical factor, with frequencies having small integer ratios, for example, 2:1, creating strong fluid vorticity when the third magnetic field component is fixed or constant, i.e., DC. See J. E. Martin and K. J. Solis, "Symmetry-breaking magnetic fields create a vortex fluid that exhibits a negative viscosity, active wetting, and strong mixing," Soft Matter, vol. 10, pp. 3993-4002 (2014) and K. J. Solis and J. E. Martin, "Torque density measurements on vortex fluids produced by symmetry-breaking rational magnetic fields," Soft Matter, vol. 10, pp. 6139-6146 (2014) for a description of fluid vorticity as a function of magnetic field components for fluid mixing and heat transfer applications, i.e., not underfilling applications which do not use fluid vorticity for fluid mixing or heat transfer. When all three magnetic field frequencies are alternating, the frequency ratio 1:2:3 creates the largest torque density in the fluid for any given magnetic field strength and creates a fluid vorticity that circulates around the magnetic field component with the intermediate frequency. See J. E. Martin and K. J. Solis, "Fully alternating, triaxial electric or magnetic fields offer new routes to fluid vorticity," Soft Matter, vol. 11, pp. 241-254 (2015) and J. E. Martin and K. J. Solis, "Quantifying vorticity in magnetic particle suspensions driven by symmetric and asymmetric multiaxial fields," Soft Matter, vol. 11, pp. 7130-7142 (2015) for additional information regarding fluid vorticity as a function of magnetic field components for fluid mixing and heat transfer applications, i.e., not underfilling applications which do not use fluid vorticity for fluid mixing or heat transfer. For spatially uniform magnetic fields, for example, those created by Helmholtz coils, the torque density is uniform throughout the volume of the magnetic particle-loaded curing resin.

Some embodiments employ magnetic fields that create a strongly time-dependent torque density. In other words, either the direction or magnitude of the fluid vorticity vector (the vector around which the fluid vorticity occurs), is time dependent. To make the torque density vector oscillate around a fixed direction (similar to a washing machine motion) it is only necessary to phase modulate by detuning the frequency of one or two of the magnetic field components. However, it is also possible to modulate the direction of the fluid vorticity vector and its magnitude as well by applying a DC bias to the low frequency magnetic field component and phase modulating one or more of the magnetic field components. See J. E. Martin and K. J. Solis, "Creating orbiting vorticity vectors in magnetic particle suspensions through field symmetry transitions-a route to multi-axis mixing," Soft Matter, vol. 12, pp. 1021-1031 (2016) and J. E. Martin, "On the origin of vorticity in magnetic particle suspensions subjected to triaxial fields," Soft Matter, vol. 12, pp. 5636-5644 (2016) for information regarding fluid vorticity as a function of magnetic field components, including DC magnetic field components. The applications addressed by these two references again include fluid mixing and heat transfer applications, i.e., not underfilling applications which do not use fluid vorticity for fluid mixing or heat transfer. In one set of experiments, a DC bias applied to the 5 Hz magnetic field component was equal to the rms amplitude of the oscillating 5 Hz magnetic field component, and the nominally 5 Hz, 10 Hz, and 15 Hz magnetic field components all had rms amplitudes of 67 Oe. The rms value of the total magnetic field in this case was the square root of three times this, i.e., 116 Oe. The 5 Hz magnetic field component was detuned to 4.9 Hz and the 15

Hz magnetic field component was tuned to 15.1 Hz, i.e., the detuning was less than or equal to approximately 2%, and the corresponding ratio of the two frequencies $$\left(\frac{15.1}{4.9} = 3.081\right)$$

was within 3% of a rational number greater than 1. These parameter choices create a fluid vorticity vector that undergoes a complex-shaped orbit in three dimensions, as described in the above cited references.

Figure 7A:
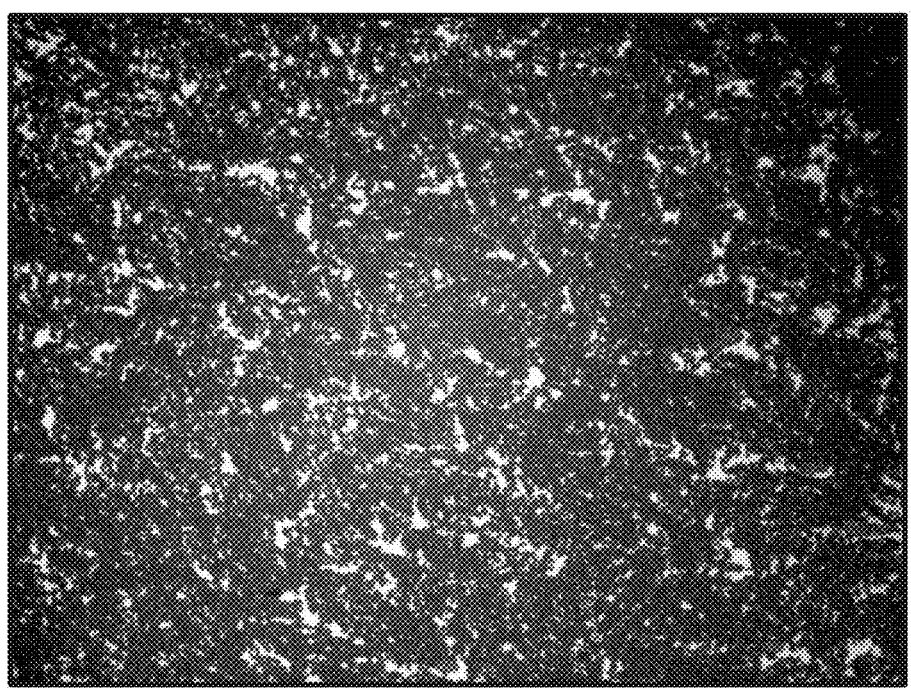
FIGS. 7A and 7B illustrate the results of underfilling processes in accordance with the prior art and with one or more embodiments of the present invention, respectively.
Figure 7B:

The application of this complex-shaped orbit has a profound effect on underfilling, increasing its rate, creating more thorough filling, and reducing particle segregation. The much greater particle uniformity can be seen in the 25 mm test pieces experimentally prepared. These test pieces had glass for the upper surface, so particle segregation, void formation, and incomplete underfilling could be observed. In the test piece underfilled without the magnetic field, i.e., the prior art underfilling process, the underfilling was incomplete and there was significant particle segregation, as shown in FIG. 7A. The part underfilled in the presence of the phase-modulated 1+dc:2:3 triaxial magnetic field exhibited extremely high particle uniformity, and underfilled completely and rapidly, as shown in FIG. 7B. Both FIGS. 7A and 7B were taken at the same magnification. The specific magnetic field used to produce the results illustrated in FIG. 7B was a phase-modulated (1+dc:2:3) field that created a vorticity vector orbit. It should be noted that the 25 mm test pieces included 50 μm deep trenches that the underfill readily traversed in the case with the applied magnetic field. Similar results were obtained when the 25 mm test pieces included 100 μm deep trenches.

The concept of using spatially uniform, multiaxial magnetic fields to enhance underfilling is very broad. Each of the three orthogonal magnetic field components has two basic parameters: the magnetic field strength and the magnetic field frequency. In addition, there are two independent phase angles between the three orthogonal magnetic components, and these can be fixed, or be a function of time, as occurs for phase modulation by frequency detuning. Further, a DC bias can be added to any one or more of the three magnetic field components. The magnetic field possibilities are endless as the magnetic fields can be applied that create a fixed fluid vorticity vector along any magnetic field component, an oscillating fluid vorticity vector, or one of an infinite number of possible 3-dimensional fluid vorticity vector orbits. As will be appreciated by one of skill, these various degrees of freedom will need to be optimized for a given underfilling application.

As will also be appreciated by one of skill, this underfilling process requires vorticity, i.e., that the multiaxial magnetic fields can cause the curing resin to flow. Whether vorticity occurs is determined by the Mason number, Mn, of the curing resin, which is given by:

$$Mn=9\eta\omega/(2\mu_2 M^2),\qquad\text{(Eq. 2)}$$

where $\eta$ is the viscosity of the curing resin, $\omega$ is the frequency of the multiaxial magnetic field component in radians/s, $\mu_0$ is the magnetic permeability of free space, and M is the magnetization of the magnetic particles. It has been determined that vorticity will occur when Mn is less than approximately 0.2, but strong vorticity occurs when Mn is less than approximately 0.02. Thus, one needs to minimize the Mason number, Mn, of the curing resin to achieve vorticity. There are three factors that one can control to achieve a Mason number, Mn, in the desired range. First, one can use low frequency magnetic fields. As discussed above, a fundamental frequency $f_0$ in the range of approximately 5 Hz to 500 Hz will suffice. Second, a curing resin with a low viscosity is required. Third, one can heat the curing resin, which further serves to lower its viscosity. The torque density appears to have little to no dependence on the size of the magnetic particles, the liquid viscosity, or the magnetic field frequency, as long as the Mason number, Mn, is less than 0.2, and preferably less than 0.02. In contrast, the torque density exhibits a quadratic dependence on the magnetic field strength and can be affected by the shape of the magnetic particles. As illustrated above in FIG. 4, significant torque density can be achieved in viscous magnetic particle-loaded curing resins at low magnetic field frequencies.

Figure 8:
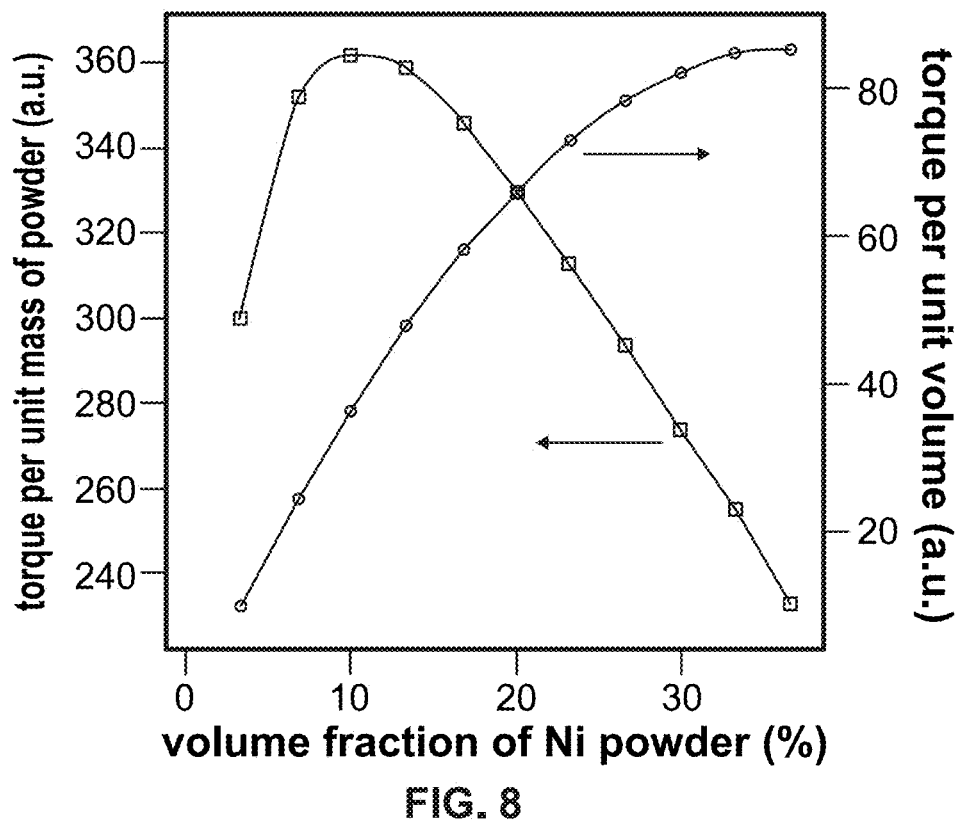
FIG. 8 illustrates experimental results of the torque per unit mass and torque per unit volume for Ni magnetic particles that may be used with one or more embodiments of the present invention.

One might expect that the torque would increase with the volume fraction of the magnetic particles. However, measurements using a Ni powder showed that this increase is sub-linear, as illustrated in FIG. 8. Of particular interest is that the torque saturated at a volume fraction of 40% Ni powder. The specific torque, i.e., the measured torque per unit mass of the Ni powder, actually maximized at a volume fraction of only 10%. For magnetic Ni platelets, this optimal volume fraction is even lower, roughly 1-2%.

Finding the magnetic particles that generate the greatest torque density for a given curing resin is a nontrivial task that is largely experimental. There are several contributing factors to consider when maximizing the torque density. The first is the formation of magnetic particles into chains that follow, but lag behind, the magnetic field vector. This contribution depends on the strength of the magnetic attractions between contacting magnetic particles and is a collective effect. The second contribution is the shape of the magnetic particle. Anisometric magnetic particles will align with their major axis parallel to the field, creating a lag between their major axis and the instantaneous field vector, which creates a torque. The shape of the magnetic particles also strongly affects polarization. The third contribution is due to the possibility of a lag between the particle magnetic polarization and the magnetic field vector, which creates the torque. This lag can be due to a frequency-dependent polarizability or magnetic remanence.

The torque density increases with the strength of the interaction between the magnetic particles. This interaction increases with the magnetic particle polarization but is also dependent on the details of the magnetic particle geometry at the point of contact, with larger contact areas giving greater forces. In order to maximize magnetic particle polarization, one might choose the material with the largest magnetic permeability, but magnetic particle polarization has much more to do with the shape of the magnetic particle than with its permeability. In fact, for typical magnetic materials, magnetic particle polarization is effectively independent of the magnetic permeability. For example, a spherical magnetic particle will have a measured relative magnetic permeability (defined as one plus its magnetization density divided by the applied field) of only 4, whether the relative magnetic permeability of the magnetic particle material of which it is comprised is 100, 1000, or even 1,000,000,000. This effect is due to the depolarizing magnetic fields that form at the surface of the magnetic particle and oppose the applied magnetic field. However, the magnetic polarization is strongly dependent on the shape of the magnetic particle, and this dependence can be computed analytically for the family of generalized solid ellipsoids, to include prolate and oblate spheroids. Highly elongated prolate spheroids have high measured relative magnetic permeabilities parallel to their major axis, as do oblate spheroids. Thus, such shapes should exhibit large specific torque densities, and they do. However, these magnetic particle powders are not very dense, and so have much lower packing densities than do spherical magnetic particle powders. Materials that have significant magnetic remanence include Ni and stainless steel powders. This magnetic remanence significantly increases the torque density these magnetic particle powders generate.

Figure 9:
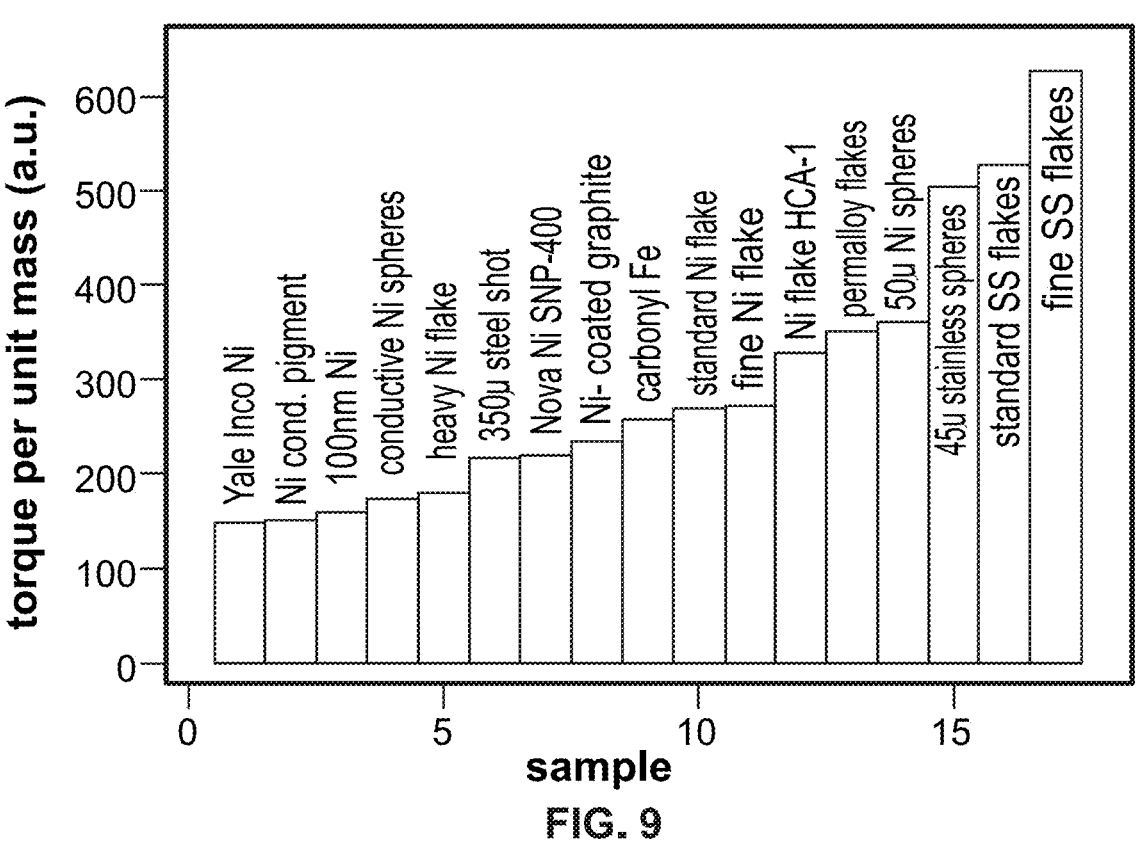
FIG. 9 provides a summary of the torque measured for various magnetic particles that may be used with one or more embodiments of the present invention.

Specific torque (i.e., the measured torque per unit mass) measurements were made on a variety of magnetic particles and the results are summarized in FIG. 9. Measurements were made at 72 Hz and 150 Oe rms per magnetic field component. The dynamic magnetic field vector thus had a constant magnitude of 260 Oe. Magnetic particles in the form of flakes tended to have high specific torques due to their shape enabling a high apparent particle permeability. Magnetic particles in the form of 45 micron stainless steel spheres were also exceptional, due to their large magnetic remanence, having about twice the specific torque of magnetic particles in the form of Fe spheres, which have little remanence. Magnetic particles in the form of stainless steel spheres, due to their high packing density, gave the highest torque for a given packing volume. However, these stainless steel spheres will not be suitable for many underfilling applications due to the relatively small gap that needs to be filled. In contrast, the Ni magnetic nanoparticles are most suitable for extremely small gaps, such as may be found in many underfilling applications, but have relatively little torque production.

An experiment was conducted to determine if the torque density of a magnetic particle powder can be improved by adding much smaller magnetic nanoparticles. The thought was that the field non-uniformities created using magnetic particles in the form of stainless steel spheres would create a Kelvin force on the much smaller magnetic nanoparticles, causing the magnetic nanoparticles to migrate to the high field regions that occur at the gaps between the stainless steel spheres. These magnetic nanoparticles would form bridges between the stainless steel spheres, increasing the force of their attraction. To test this concept, small amounts of 100 nm Ni particles were added to the stainless steel powder, i.e., the size of 100 nm Ni particles was ≤10% of the size of the stainless steel powder, which was 45 μm. These amounts of 100 nm Ni particles were too small to generate an appreciable torque by themselves, but even when the 100 nm Ni particles comprised as little as 5 wt. % of the powder mixture, they boosted the measured torque by 27%. Further increases in the 100 nm Ni particle content did little to increase the torque.

All publications, including but not limited to patents and patent applications, cited in this specification are herein incorporated by reference as though set forth in their entirety in the present application.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising the steps of:
providing a carrier chip;
providing one or more die;

electrically interconnecting each of the one or more die to the carrier chip;
preparing a curing resin by loading the curing resin with magnetic particles, thereby creating a magnetic particle-loaded curing resin;
applying the magnetic particle-loaded curing resin along at least one edge of at least one of the one or more die;
subjecting the one or more die and the carrier chip to a vacuum to remove at least a portion of air trapped in a space between the one or more die and the carrier chip; and
subjecting the one or more die and the carrier chip to a multiaxial magnetic field to drive distribution of the magnetic particle-loaded curing resin throughout the space between the one or more die and the carrier chip.

2. The method of claim 1, wherein the step of preparing a curing resin includes at least one of:
sonication to reduce the number of magnetic particle clumps; or
vortex mixing process to disperse the magnetic particles within the curing resin.

3. The method of claim 1, wherein the magnetic particles include one or more magnetically soft materials.

4. The method of claim 1, wherein the magnetic particles include at least one of iron, nickel, iron oxide, or stainless steel.

5. The method of claim 1, wherein a size of the magnetic particles is less than or equal to approximately 33% of a size of a gap between the carrier chip and the one or more die.

6. The method of claim 1, wherein the magnetic particles comprise between approximately 5 vol. % and 20 vol. % of the magnetic particle-loaded curing resin.

7. The method of claim 1, wherein a first portion of the magnetic particles have a first size, and a second portion of the magnetic particles have a second size, the second size being approximately 10% or less of the first size.

8. The method of claim 1, wherein the step of preparing a curing resin further includes loading the curing resin with nonmagnetic particles.

9. The method of claim 8, wherein the nonmagnetic particles are adapted to cause a coefficient of thermal expansion of the magnetic particle-loaded curing resin to more closely match a coefficient of thermal expansion of the carrier chip or the one or more die.

10. The method of claim 8, wherein at least one of:
a size of the nonmagnetic particles is less than or equal to approximately 33% of a size of a gap between the carrier chip and the one or more die; or
the nonmagnetic particles comprise between approximately 20 vol. % and 30 vol. % of the magnetic particle-loaded curing resin.

11. The method of claim 1, wherein the step of applying the magnetic particle-loaded curing resin includes applying the magnetic particle-loaded curing resin along at least a portion of all sides of each of the one or more die.

12. The method of claim 1, wherein the step of subjecting the one or more die and the carrier chip to a vacuum employs a vacuum oven.

13. The method of claim 1, wherein the step of subjecting the one or more die and the carrier chip to a vacuum further includes subjecting the one or more die and the carrier chip to a thermal process.

14. The method of claim 1, wherein the multiaxial magnetic field includes three orthogonal magnetic field components.

15. The method of claim 14, wherein a first and a second of the three orthogonal magnetic field components each includes a respective AC magnetic field component; and wherein a third of the three orthogonal magnetic field components includes a DC magnetic field component.

16. The method of claim 14, wherein a first, a second, and a third of the three orthogonal magnetic field components each includes a respective AC magnetic field component; and wherein the third of the three orthogonal magnetic field components further includes a DC magnetic field component.

17. The method of claim 14, wherein a phase angle exists between a first and a second of the three orthogonal magnetic field components.

18. The method of claim 14, wherein a ratio of a frequency of a first of the three orthogonal magnetic field components and a frequency of a second of the three orthogonal magnetic field components is a rational number greater than 1.

19. The method of claim 14, wherein a ratio of a frequency of a first of the three orthogonal magnetic field components and a frequency of a second of the three orthogonal magnetic field components is within 3% a rational number greater than 1.

20. The method of claim 1, wherein a frequency of each magnetic field component of the multiaxial magnetic field is less than or equal to approximately 1 KHz.

* * * * *